(12) United States Patent
Lee et al.

(10) Patent No.: US 8,384,455 B2
(45) Date of Patent: Feb. 26, 2013

(54) APPARATUS FOR CLOCK SKEW COMPENSATION

(75) Inventors: Yu Lee, Hsinchu County (TW);
Nai-Chen Cheng, Changhua County (TW); Ji-Jan Chen, Kaohsiung (TW);
Yuan-Hua Chu, Hsinchu County (TW);
Ching-Yuan Yang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 13/114,030

(22) Filed: May 23, 2011

(65) Prior Publication Data

US 2012/0146693 A1    Jun. 14, 2012

(30) Foreign Application Priority Data

Dec. 13, 2010  (TW) .............................. 99143541 A

(51) Int. Cl.
*H03L 7/06* (2006.01)
(52) U.S. Cl. ...................................... 327/158; 327/149
(58) Field of Classification Search .................. 327/149, 327/158
See application file for complete search history.

(56) References Cited

U.S. PATENT DOCUMENTS

| | | | |
|---|---|---|---|
| 5,594,376 A | 1/1997 | McBride et al. | |
| 6,005,430 A | 12/1999 | Brown et al. | |
| 6,275,555 B1 | 8/2001 | Song | |
| 6,754,841 B2 | 6/2004 | Yang | |
| 7,526,666 B1 * | 4/2009 | Soni | 713/500 |
| 7,560,963 B2 | 7/2009 | Yun et al. | |
| 7,710,173 B2 | 5/2010 | Shim | |
| 7,714,565 B2 | 5/2010 | Abuhamdeh et al. | |
| 7,778,095 B2 | 8/2010 | Na | |
| 8,040,645 B2 * | 10/2011 | Jalilizeinali et al. | 361/56 |
| 8,289,806 B2 * | 10/2012 | Gomm | 365/233.1 |
| 2009/0243679 A1 * | 10/2009 | Smith et al. | 327/158 |
| 2009/0323456 A1 * | 12/2009 | Gomm | 365/233.1 |
| 2010/0039740 A1 * | 2/2010 | Jalilizeinali et al. | 361/56 |
| 2012/0146693 A1 * | 6/2012 | Lee et al. | 327/158 |

FOREIGN PATENT DOCUMENTS

| | | |
|---|---|---|
| TW | 200601705 | 1/2006 |
| TW | 200723698 | 6/2007 |

OTHER PUBLICATIONS

Saeki et al, "A 2.5-ns Clock Access, 250-MHz, 256-Mb SDRAM with Synchronous mirror delay", IEEE Journal of Solid Circuits, Nov. 1999, p. 1656-1668, vol. 31.
Liu et al., "Low-Power Clock-Deskew Buffer for High-Speed Digital Circuits", IEEE Journal of Solid-State Circuits, Apr. 1999, p. 554-558, vol. 34.
Okajima et al., "Digital Delay Locked Loop and Design Technique for High-Speed Synchronous Interface", IEICE Trans. Electron., Jun. 1996, p. 798-807, vol. E79-C.
Dehng et al., "Clock-Deskew Buffer Using a SAR-Controlled Delay-Locked Loop", IEEE Journal of Solid-State Circuits, Aug. 2000, p. 1128-1136, vol. 35.

* cited by examiner

*Primary Examiner* — Adam Houston
(74) *Attorney, Agent, or Firm* — Jianq Chyun IP Office

(57) ABSTRACT

An apparatus for clock skew compensation is provided. The apparatus includes a first delay locked loop (DLL) module disposed in a first die and a second DLL module disposed in a second die. A first input terminal of the first DLL module receives a reference clock. A first input terminal of the second DLL module is electrically connected to an output terminal of the first DLL module. An output terminal of the second DLL module is electrically connected to a second input terminal of the first DLL module.

10 Claims, 8 Drawing Sheets

US 8,384,455 B2

APPARATUS FOR CLOCK SKEW COMPENSATION

CROSS-REFERENCE TO RELATED APPLICATION

This application claims the priority benefit of Taiwan application serial no. 99143541, filed Dec. 13, 2010. The entirety of the above-mentioned patent application is hereby incorporated by reference herein and made a part of this specification.

1. Technical Field

The disclosure relates to clock skew compensation. Particularly, the disclosure relates to an apparatus for clock skew compensation for clock signals transmitted between different dies.

2. Background

Early electronic systems have less demand in performance, so that a design burden can be reduced through a relatively low signal transmission speed (relatively large clock cycle), and accordingly a proportion of a clock skew amount in a whole duty cycle (or the clock cycle) is very tiny. In other words, a chance of system error caused by clock skew is very tiny. However, as integrated circuits are quickly developed, an operation speed and a communication bandwidth of the electronic system are continuously increased. The operation speed of the electronic system for various protocols is greatly increased to provide a client/user the maximum amount of bandwidth. As the clock cycle is reduced, the clock skew amount occupies a large percentage in signal intervals, so that the clock asynchronization may cause a timing error of the electronic system. Therefore, the clock skew is one of important factors determining a system performance of a current high-speed system.

SUMMARY

An exemplary embodiment of the disclosure provides an apparatus for clock skew compensation. The apparatus includes a first delay locked loop (DLL) module and a second DLL module. The first DLL module is disposed in a first die, and the second DLL module is disposed in a second die. A first input terminal of the first DLL module receives a reference clock. A first input terminal of the second DLL module is electrically connected to an output terminal of the first DLL module. An output terminal of the second DLL module is electrically connected to a second input terminal of the first DLL module.

Another exemplary embodiment of the disclosure provides an apparatus for clock skew compensation. The apparatus includes a first delay locked loop (DLL) module and a second DLL module. The first DLL module is disposed in a first die, and the second DLL module is disposed in a second die. A first input terminal of the first DLL module receives a reference clock. A first input terminal of the second DLL module is electrically connected to an output terminal of the first DLL module and a second input terminal of the first DLL module through different transmission channels. A second input terminal of the second DLL module receives the reference clock through the first die. The reference clock is an operating clock of the first die, and a clock of an output terminal of the second DLL module serves as an operating clock of the second die.

According to the above descriptions, the apparatus for clock skew compensation applies a latch-based dual DLL (LBD-DLL) technique, which can correct/compensate skew of clocks on different dies without assistance of a delay measurement (DM) circuit or a dummy channel. Therefore, the apparatus for clock skew compensation of the disclosure can mitigate the problem of clock asynchronization between different dies.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Clock skew is generally formed due to delays of a signal passing through different paths, and the delays are generally generated due to process, voltage, temperature and loading (PVTL) variations. For example, in a system on chip (SoC), a set of local oscillator is used to provide a system clock, and such clock is distributed to a plurality of different application systems, for example, a synchronous dynamic random access memory (SDRAM), a digital signal processor (DSP), and an analog-to-digital converter (ADC), etc. If the clock has an unexpected skew, the system may have a timing error. When the system clock is transmitted among a plurality of dies, for example, in case of a die stacking application, the clock skew may cause asynchronous operating clocks of different dies.

Figure 1A:
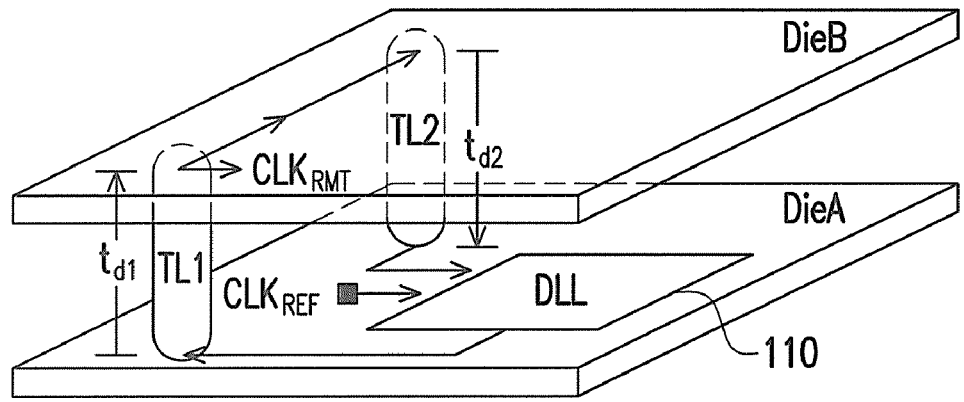
FIG. 1A is a three-dimensional view of an apparatus for clock skew compensation applied for a die stacking structure.
Figure 1B:
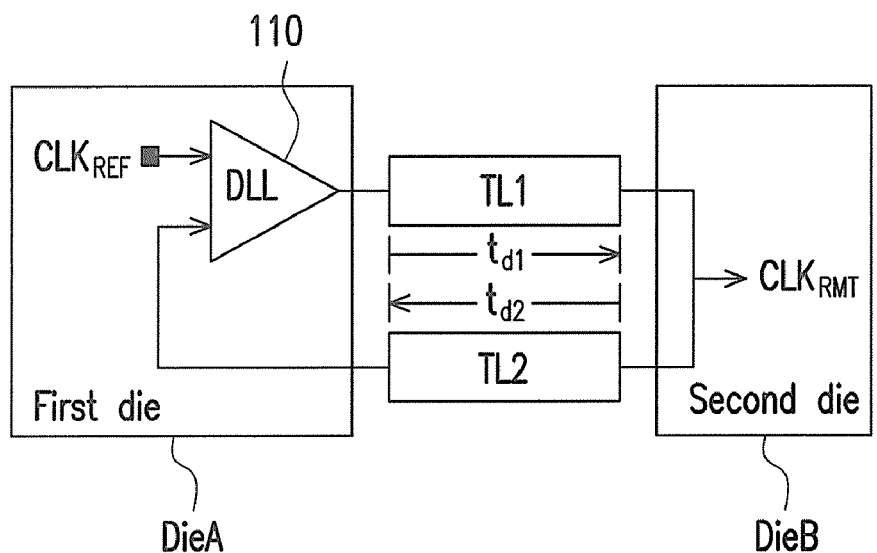
FIG. 1B is a circuit schematic diagram of the apparatus for clock skew compensation shown in FIG. 1A.

FIG. 1A is a three-dimensional view of an apparatus for clock skew compensation applied for a die stacking structure. FIG. 1B is a circuit schematic diagram of the apparatus for clock skew compensation shown in FIG. 1A. Referring to FIG. 1A and FIG. 1B, the die stacking structure includes a first die DieA and a second die DieB. The first die DieA and the second die DieB can be communicated with each other through a transmission channel (for example, a transmission channel TL1) there between. For example, the first die DieA transmits an operating clock to the second die DieB through the transmission channel TL1. The transmission channel TL1 can be a transmission wire or a through-silicon via (TSV). The TSV integrates different dies through a vertical stacking method, so as to reduce a die complexity and a crowding degree. Moreover, as the TSV technique becomes mature, a size of a micro joint thereof can be reduced below 20 µm, so that features such as a connection size, an operating bandwidth, power consumption and a heterogeneous integration, etc. can all be ameliorated. However, each of the TSVs has a feature difference due to a fabrication process thereof.

Regarding the system clock transmission, under a condition of fault-free, since the TSV has a characteristic of ultra-high bandwidth, clocks between bare dies of different layers can be regarded as synchronous, which does not influence an operating characteristic of the whole system. However, if the TSV is dislocated or has a resistive defect, the operating bandwidth thereof is greatly reduced, in other words, a signal delay amount is increased. Such effect may lead to a severe skew of the clock signal between the bare dies, and lead to an operation error of the system. Therefore, in a three-dimensional (3D) integrated circuit (3D-IC), a clock phase correction mechanism is required, so that when an unknown delay of the TSV is occurred, such mechanism can still correct/compensate the clocks to ensure a normal operation of the system.

In FIG. 1A and FIG. 1B, an apparatus for clock skew compensation for clocks on different dies is illustrated. As shown in FIG. 1B, the apparatus for clock skew compensation applies a delay-locked loop (DLL) 110 and a dummy channel (TL2). The DLL 110 outputs a corresponding clock according to a reference clock $CLK_{REF}$ (For example, an operating clock of the first die DieA). The transmission channel TL1 transmits the clock output from the DLL 110 of the first die DieA to the second die DieB to serve as an operating clock $CLK_{RMT}$ of the second die DieB. The dummy channel TL2 is used as a dummy delay element of the transmission channel TL1. The transmission channel TL1 has a delay time $t_{d1}$, and the dummy channel TL2 has a delay time $t_{d2}$. Ideally, the dummy channel TL2 and the transmission channel TL1 have the same delay characteristic, i.e. $t_{d1}=t_{d2}$. In this way, the DLL 110 can compare the reference clock with a feedback clock fed back from the dummy channel TL2 to correspondingly adjust a phase of the output clock thereof, so that a transmission delay amount of the transmission channel TL1 can be eliminated or compensated, i.e. the reference clock $CLK_{REF}$ and the remote clock $CLK_{RMT}$ are synchronous clocks. Therefore, in the embodiment of FIG. 1A and FIG. 1B, a closed-loop correction can be implemented to reach clock synchronization between the first die DieA and the second die DieB.

However, the embodiment shown in FIG. 1A and FIG. 1B may have a correction accuracy problem in some circumstances since a delay amount of the dummy channel TL2 is also varied along with environmental variations (including process, voltage, temperature and loading (PVTL) variations). Therefore, a delay error amount $|t_{d1}-t_{d2}|$ of the two transmission channels TL1 and TL2 cannot be neglected. When the system correction is completed, the clocks $CLK_{REF}$ and $CLK_{RMT}$ still have the clock phase error amount $|t_{d1}-t_{d2}|$. Such value can be neglected under a low speed clock operation, though in case of the high-speed system, it may cause a timing error and lead to system performance reduction or system error.

Figure 2:
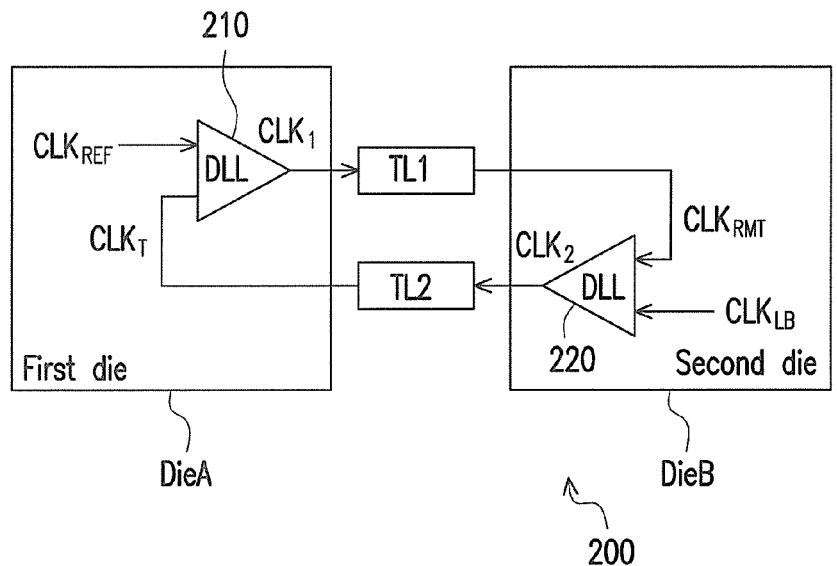
FIG. 2 is a circuit schematic diagram illustrating an apparatus for clock skew compensation according to an exemplary embodiment of the disclosure.

Therefore, FIG. 2 is a circuit schematic diagram illustrating an apparatus for clock skew compensation according to an exemplary embodiment of the disclosure. Referring to FIG. 2, the apparatus for clock skew compensation 200 includes a first DLL module 210 and a second DLL module 220. The first DLL module 210 is disposed in the first die DieA, and the second DLL module 220 is disposed in the second die DieB. In the present exemplary embodiment, the first die DieA and the second die DieB can be stacked on each other. However, in other embodiments, the first die DieA and the second die DieB are probably disposed on a same plane in a non-stacking mode. The first die DieA and the second die DieB can be communicated through transmission channels (for example, the transmission channels TL1 and the transmission channel TL2). The transmission channels TL1 and the transmission channel TL2 can be transmission wires or TSVs, etc.

A first input terminal of the first DLL module 210 receives the reference clock $CLK_{REF}$ (for example, an operating clock of the first die DieA). A first input terminal of the second DLL module 220 is electrically connected to an output terminal of the first DLL module 210 through the transmission channel TL1, and an output terminal of the second DLL module 220 is electrically connected to a second input terminal of the first DLL module 210 through the transmission channel TL2. A clock of the first input terminal of the second DLL module 220 is $CLK_{RMT}$, and a clock of the output terminal of the second DLL module 220 is $CLK_2$. The clock $CLK_{RMT}$ or the clock $CLK_2$ can be used as an operating clock of the second chip DieB according to an actual design requirement.

In the present exemplary embodiment, controlled delay lines of different DLL modules are used to respectively compensate transmission delays of the two transmission channels TL1 and TL2, and the reference clock $CLK_{REF}$ and the remote clock $CLK_{RMT}$ are forced to be consistent through the DLL mechanism, so as to achieve the clock synchronization. Here, it is assumed that a transmission delay amount of the first DLL module 210 is $t_{VCDL1}$, a transmission delay amount of the second DLL module 220 is $t_{VCDL2}$, a transmission delay amount of the transmission channel TL1 is $t_{TL1}$, and a transmission delay amount of the transmission channel TL2 is $t_{TL2}$. In a first loop of FIG. 2, after the reference clock $CLK_{REF}$ enters the apparatus for clock skew compensation 200, the first DLL module 210 forces a feedback clock $CLK_T$ to be synchronized with the reference clock $CLK_{REF}$, and the feedback clock $CLK_T$ is generated by the reference clock $CLK_{REF}$ transmitted through two transmission channels TL1 and TL2 and two DLL modules 210 and 220. Therefore, after the first DLL module 210 is stable, the transmission delay amount of this loop is set to an even multiple of a cycle time $T_{CLKREF}$ of the reference clock $CLK_{REF}$. Here, twice of the cycle time of the reference clock $CLK_{REF}$ is taken as an example, as that shown in a following equation (1):

$$t_{VCDL1}+t_{TL1}+t_{VCDL2}+t_{TL2}=2T_{CLKREF} \quad (1)$$

In a second loop of FIG. 2, the second DLL module 220 compares phases of the remote clock $CLK_{RMT}$ and a feedback clock $CLK_{LB}$ to modify the clock $CLK_2$, where the remote clock $CLK_{RMT}$ is generated by the reference clock $CLK_{REF}$ transmitted through the first DLL module 210 and the transmission channel TL1. The feedback clock $CLK_{LB}$ is a feedback of a suitable clock signal in the system.

Figure 3:
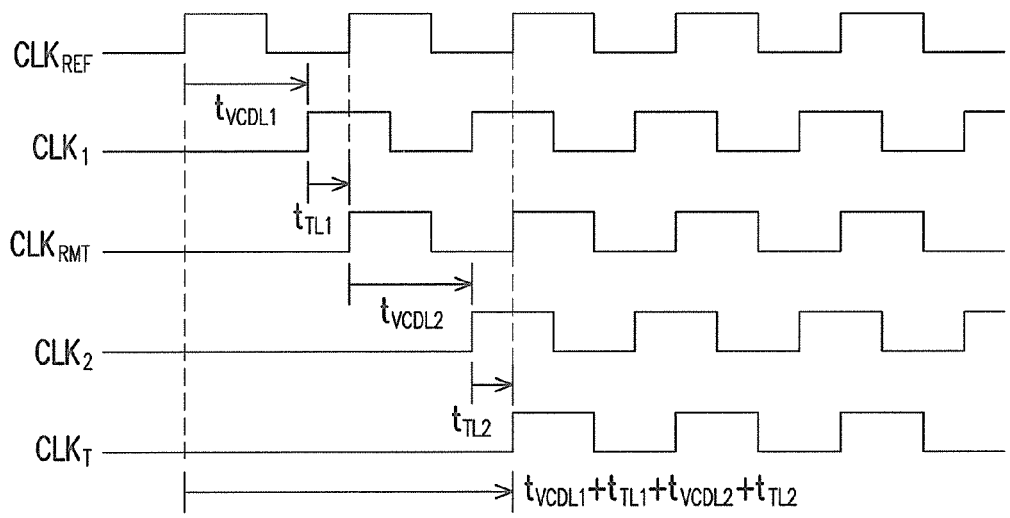
FIG. 3 is a timing diagram of clocks of FIG. 2 according to an exemplary embodiment of the disclosure.

FIG. 3 is a timing diagram of the clocks of FIG. 2 according to an exemplary embodiment of the disclosure. Since the transmission channel TL1 and the transmission channel TL2 have different characteristics, the two transmission channels TL1 and TL2 may contribute different transmission delay amounts of $t_{TL1}$ and $t_{TL2}$. In the exemplary embodiment of FIG. 2 and FIG. 3, in order to synchronize the feedback clock $CLK_T$ and the remote clock $CLK_{RMT}$, the delay amount $t_{VCDL2}$ of the controlled delay line in the second DLL module 220 is increased, so that a sum of such delay amount $t_{VCDL2}$ and the delay amount $t_{TL2}$ of the transmission channel TL2 is equal to an integral multiple of the cycle time $T_{CLKREF}$ of the reference clock $CLK_{REF}$, i.e. $t_{VCDL2}+t_{TL2}=T_{CLKREF}$, which represents that a delay variation of the transmission channel TL2 is corrected by the second loop formed by the second DLL module 220, i.e. in a fully synchronous system, only the delay amount $t_{TL1}$ of the transmission channel TL1 is left uncertain. Therefore, a function of the first DLL module 210 is to eliminate the above transmission delay. According to the equation (1), it is known that a total transmission delay amount $T_{Total}$ of the first loop is $t_{VCDL1}+t_{VCDL2}+t_{TL1}+t_{TL2}$, so that when the DLL is stable, a value thereof is equal to an even multiple of the cycle time $T_{CLKREF}$ of the reference clock $CLK_{REF}$. Taking the embodiment of FIG. 3 as an example, the total transmission delay amount $T_{Total}$ is twice of the cycle time of the reference clock $CLK_{REF}$ (i.e. $2T_{CLKREF}$). This result means that under a condition that the clock $CLK_T$ and the clock $CLK_{REF}$ are forced to be synchronized and $t_{VCDL2}+t_{TL2}=T_{CLKREF}$, a sum of the delay amount $t_{TL1}$ of the transmission channel TL1 and the delay amount $t_{VCDL1}$ of the first DLL module 210 is always equal to $T_{CLKREF}$. Therefore, when the above two loops are stable, after the reference clock $CLK_{REF}$ is transmitted through the first DLL module 210 and the transmission channel TL1, the reference clock $CLK_{REF}$ and the remote clock $CLK_{RMT}$ just have a phase difference of the cycle time $T_{CLKREF}$ of the reference clock $CLK_{REF}$, which represents that the two clocks are synchronized.

Figure 4:
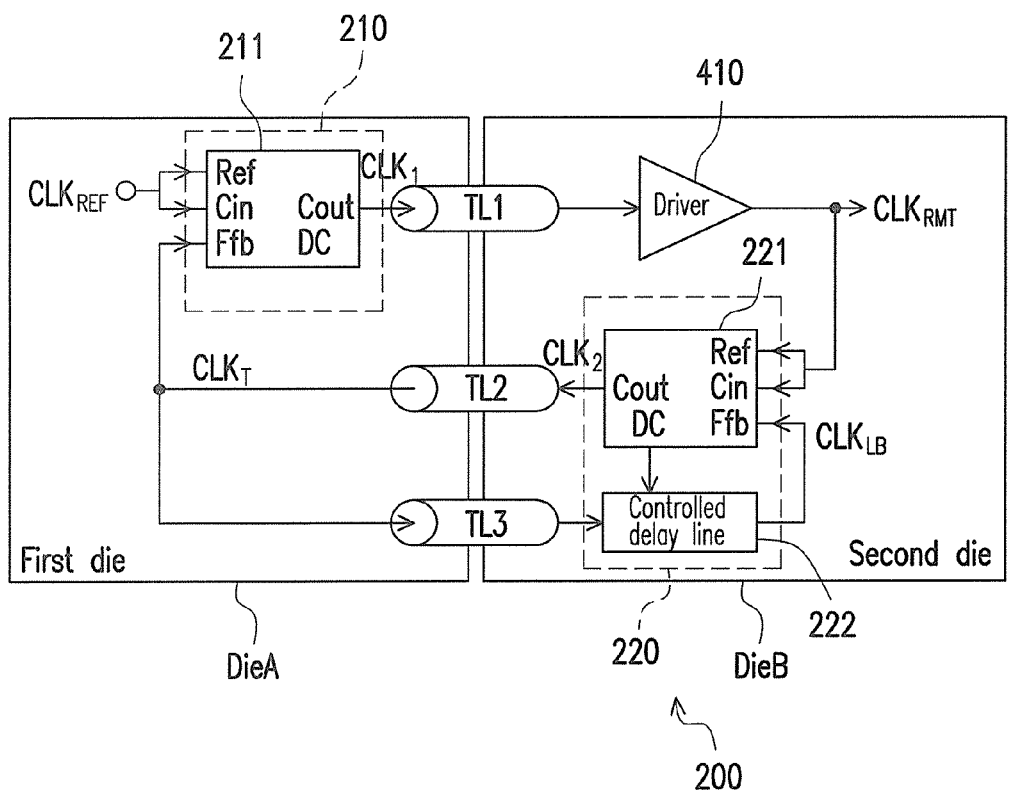
FIG. 4 is a functional block schematic diagram of the apparatus for clock skew compensation of FIG. 2 according to an exemplary embodiment of the disclosure.

In brief, as long as the feedback clock CLKLB is suitably selected, and the equation (1) is guaranteed, the apparatus for clock skew compensation 200 of FIG. 2 can successfully correct/compensate the clock phase skew. Several exemplary embodiments of the apparatus for clock skew compensation 200 of FIG. 2 are provided below. FIG. 4 is a functional block schematic diagram of the apparatus for clock skew compensation 200 of FIG. 2 according to an exemplary embodiment of the disclosure. In the present exemplary embodiment, a driver 410 receives the clock provided by the transmission channel TL1, and the driver 410 provides the remote clock $CLK_{RMT}$ to serve as the operating clock of the second die DieB.

Referring to FIG. 4, the first DLL module 210 includes a first DLL 211. A clock reference terminals Ref and a clock input terminal Cin of the first DLL 211 are electrically connected to the first input terminal of the first DLL module 210 for receiving the reference clock $CLK_{REF}$. A clock feedback terminal Ffb of the first DLL 211 is electrically connected to the second input terminal of the first DLL module 210 for receiving the feedback clock $CLK_T$ transmitted by the transmission channel TL2. A clock output terminal Cout of the first DLL 211 is electrically connected to the output terminal of the first DLL module 210 for outputting a clock $CLK_1$ to the transmission channel TL1.

Figure 5A:
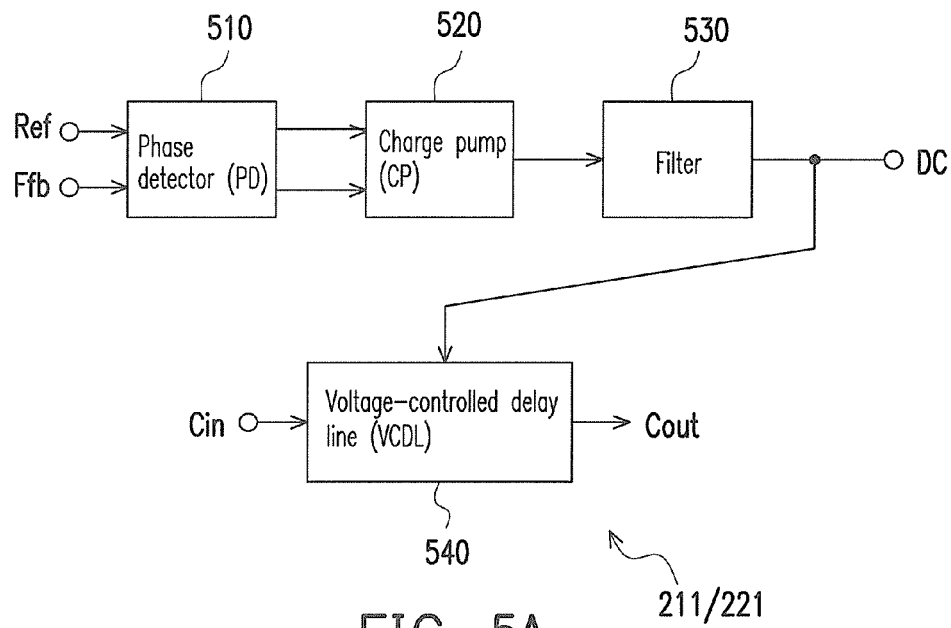
FIG. 5A is a functional block schematic diagram of a first delay locked loop (DLL) 211 according to an exemplary embodiment of the disclosure.

Implementations of the first DLL 211 are diversified, for example, FIG. 5A is a functional block schematic diagram of the first DLL 211 according to an exemplary embodiment of the disclosure. The first DLL 211 includes a phase detector (PD) 510, a charge pump (CP) 520, a filter 530, a voltage-controlled delay line (VCDL) 540, etc. Two input terminals of the PD 510 are respectively connected to the clock reference terminal Ref and the clock feedback terminal Ffb of the first DLL 211, and an output terminal of the PD 510 is coupled to the CP 520. The CP 520 correspondingly generates an analog output voltage to the filter 530 according to an output of the PD 510. The filter 530 filters the output of the CP 520 and transmits it to a delay control terminal DC of the first DLL 211 and a control terminal of the VCDL 540. The VCDL 540 determines the delay time $t_{VCDL1}$ according to the analog voltage at the control terminal, i.e. delays a signal at the clock input terminal Cin of the first DLL 211 by the delay time $t_{VCDL1}$, and transmits the delayed signal to the clock output terminal Cout of the first DLL 211. The PD 510, the CP 520, the filter 530 and the VCDL 540 are well-known techniques, and details thereof are not repeated herein.

Figure 5B:
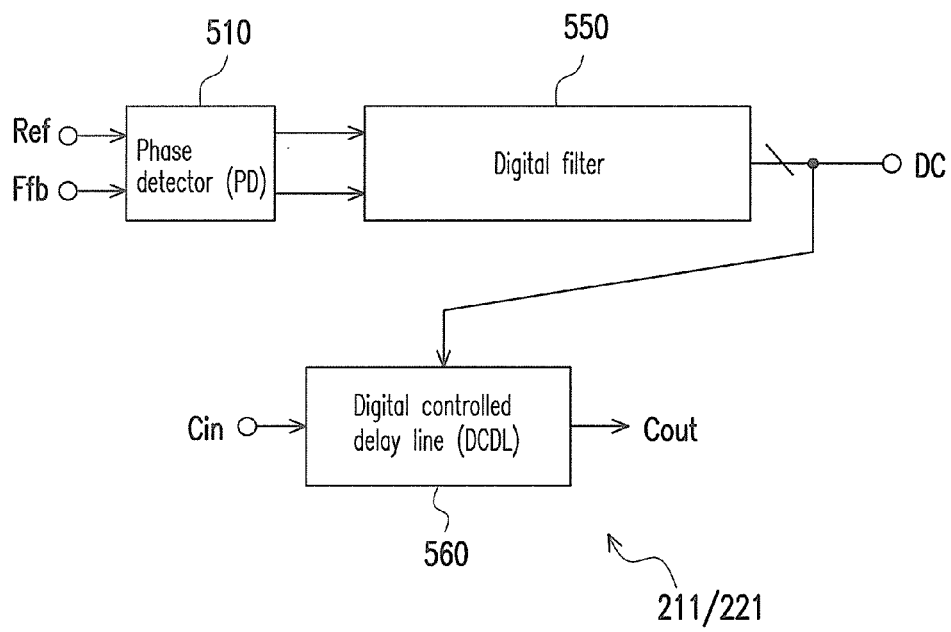
FIG. 5B is a functional block schematic diagram of a first DLL 211 according to another exemplary embodiment of the disclosure.

The first DLL 211 of FIG. 4 can also be implemented through other methods. For example, FIG. 5B is a functional block schematic diagram of the first DLL 211 according to another exemplary embodiment of the disclosure. The first DLL 211 includes a PD 510, a digital filter 550 and a digital controlled delay line (DCDL) 560, etc. Two input terminals of the PD 510 are respectively connected to the clock reference terminal Ref and the clock feedback terminal Ffb of the first DLL 211, and the output terminal of the PD 510 is coupled to the digital filter 550. The digital filter 550 filters the output of the PD 510 and generates digital data, and transmits the digital data to the delay control terminal DC of the first DLL 211 and a control terminal of the DCDL 560. The DCDL 560 determines the delay time $t_{VCDL1}$ according to the digital data at the control terminal, i.e. delays a signal at the clock input terminal Cin of the first DLL 211 by the delay time of $t_{VCDL1}$, and transmits the delayed signal to the clock output terminal Cout of the first DLL 211. The PD 510, the digital filter 550 and the DCDL 560 are well-known techniques, and details thereof are not repeated herein.

Referring to FIG. 4, the second DLL module 220 includes a second DLL 221 and a second controlled delay line (CDL) 222. Implementation of the second DLL 221 is the same as that of the first DLL 211. A control terminal of the second CDL 222 is electrically connected to the control terminal of the internal delay line (for example, the VCDL 540 of FIG. 5A or the DCDL 560 of FIG. 5B) of the second DLL 221 through the delay control terminal DC of the second DLL 221. The second CDL 222 applies a corresponding circuit design according to a signal type of the delay control terminal DC of the second DLL 221, for example, a circuit design the same to that of the VCDL 540 or the DCDL 560. Therefore, a delay amount of the second CDL 222 corresponds to a delay amount of the internal delay line of the second DLL 221. In the present exemplary embodiment, the delay amount of the second CDL 222 is the same to the delay amount $t_{VCDL2}$ of the internal delay line of the second DLL 221.

A clock reference terminal Ref and a clock input terminal Cin of the second DLL 221 are electrically connected to the first input terminal of the second DLL module 220 for receiving the remote clock $CLK_{RMT}$ provided by the driver 410. A clock output terminal Cout of the second DLL 221 is electrically connected to the output terminal of the second DLL module 220. An input terminal of the second CDL 222 is electrically connected to the clock feedback terminal Ffb of the first DLL 211 on the first die DieA through a transmission channel TL3. An output terminal of the second CDL 222 is electrically connected to the clock feedback terminal Ffb of the second DLL 221 for providing the feedback clock $CLK_{LB}$ to the second DLL module 220. The above transmission channel TL3 can be a transmission wire or a TSV, etc.

Figure 6:
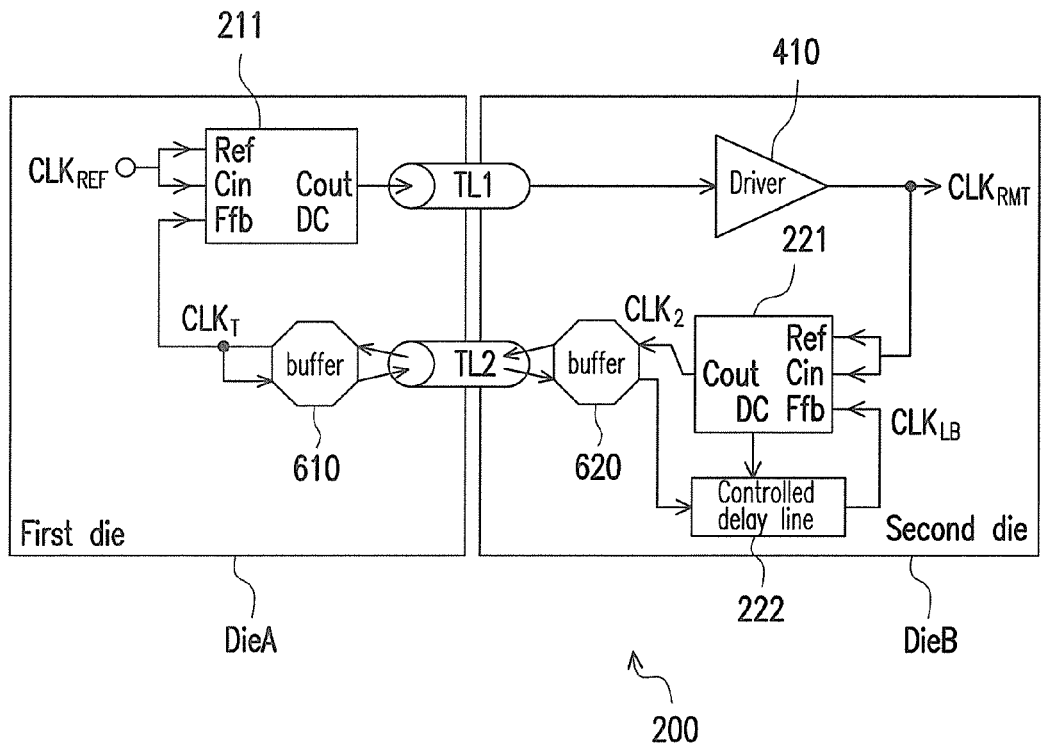
FIG. 6 is a functional block schematic diagram of the apparatus for clock skew compensation of FIG. 2 according to another exemplary embodiment of the disclosure.

In other embodiments, the transmission channel TL2 and the transmission channel TL3 can be combined into a single transmission channel. For example, FIG. 6 is a functional block schematic diagram of the apparatus for clock skew compensation 200 of FIG. 2 according to another exemplary embodiment of the disclosure. Implementation details of the embodiment of FIG. 6 are the same to that of the embodiment of FIG. 4. Different to the embodiment of FIG. 4, the embodiment of FIG. 6 further includes bi-directional buffers 610 and 620. Based on operations of the bi-directional buffers 610 and 620, the single transmission channel TL2 can serve as a transmission path for transmitting the clock $CLK_T$ from the first die DieA to the second die DieB, and can serve as a transmission path for transmitting the clock $CLK_2$ from the second die DieB to the first die DieA.

In the exemplary embodiment of FIG. 6, the internal delay line (for example, the VCDL 540 of FIG. 5A or the DCDL 560 of FIG. 5B) of the first DLL 211 is used to compensate the transmission channel TL1, and the internal delay line of the second DLL 221 and the second CDL 222 are used to eliminate the transmission delay amount of the transmission channel TL2. Here, it is assumed that a transmission delay amount of the first DLL 211 is $t_{VCDL1}$, a transmission delay amount of the second DLL 221 and the CDL 222 is $t_{VCDL2}$, a transmission delay amount of the transmission channel TL1 is $t_{TL1}$, a transmission delay amount of the transmission channel TL2 is $t_{TL2}$, and $t_{CD}$ is a clock delay of the driver 410.

Regarding a first loop formed by the first DLL 211, the transmission channel TL1, the driver 410, the second DLL 221, the bi-directional buffer 620, the transmission channel TL2, the bi-directional buffer 610 and the first DLL 211, when the first loop is stable, the transmission delay amount generated by the first loop can be set to twice of the cycle time $T_{CLKREF}$ of the reference clock $CLK_{REF}$, i.e. $2T_{CLKREF}$, and a delay time thereof can be represented by a following equation (2):

$$t_{VCDL1}+t_{TL1}+t_{CD}+t_{VCDL2}+t_{TL2}=2T_{CLKREF} \quad (2)$$

Now, the reference clock $CLK_{REF}$ and the feedback clock $CLK_T$ of the first DLL 211 are synchronous. Namely, $CLK_T=CLK_{REF}+N\times T_{CLKREF}$, where N is an integer greater than 1. Regarding a second loop formed by the second DLL 221, the bi-directional buffer 620, the transmission channel TL2, the bi-directional buffer 610, the bi-directional buffer 610, the transmission channel TL2, the bi-directional buffer 620, the CDL 222 and the second DLL 221, when the second loop is stable, the transmission delay amount generated by the second loop can be set to twice of the cycle time $T_{CLKREF}$ of the reference clock $CLK_{REF}$, and a delay time thereof can be represented by a following equation (3):

$$t_{VCDL2}+t_{TL2}+t_{TL2}+t_{VCDL2}=2T_{CLKREF}$$

or $$t_{VCDL2}+t_{TL2}=T_{CLKREF} \quad (3)$$

Now, the remote clock $CLK_{RMT}$ and the feedback clock $CLK_{LB}$ of the second DLL 221 are synchronous. Namely, $CLK_{LB}=CLK_{RMT}+N\times T_{CLKREF}$, where N is an integer greater than 1. By subtracting the equation (3) from the equation (2), a following equation (4) is obtained:

$$t_{VCDL1}+t_{TL1}+t_{CD}=T_{CLKREF} \quad (4)$$

According to the equation (4), it is known that a phase difference of the reference clock $CLK_{REF}$ and the remote clock $CLK_{RMT}$ is 360 degrees (or a time difference there between is one cycle $T_{CLKREF}$ of the reference clock $CLK_{REF}$), i.e. the reference clock $CLK_{REF}$ and the remote clock $CLK_{RMT}$ are synchronous. In the present exemplary embodiment, the function of clock skew compensation is implemented based on mutual compensation and balance of the DLL modules 210 and 220. Therefore, when the circuit is influenced by PVTL variations and delays caused by mismatch of the transmission channels, the clocks between the two dies or two circuits can still be corrected/compensated to synchronize the reference clock $CLK_{REF}$ and the remote clock $CLK_{RMT}$. Moreover, even if one of or both of the transmission channel TL1 and the transmission channel TL2 have a resistive defect, or the transmission channel TL1 and the transmission channel TL2 have a delay error there between, the function of clock phase correction/compensation can still be achieved.

Figure 7:
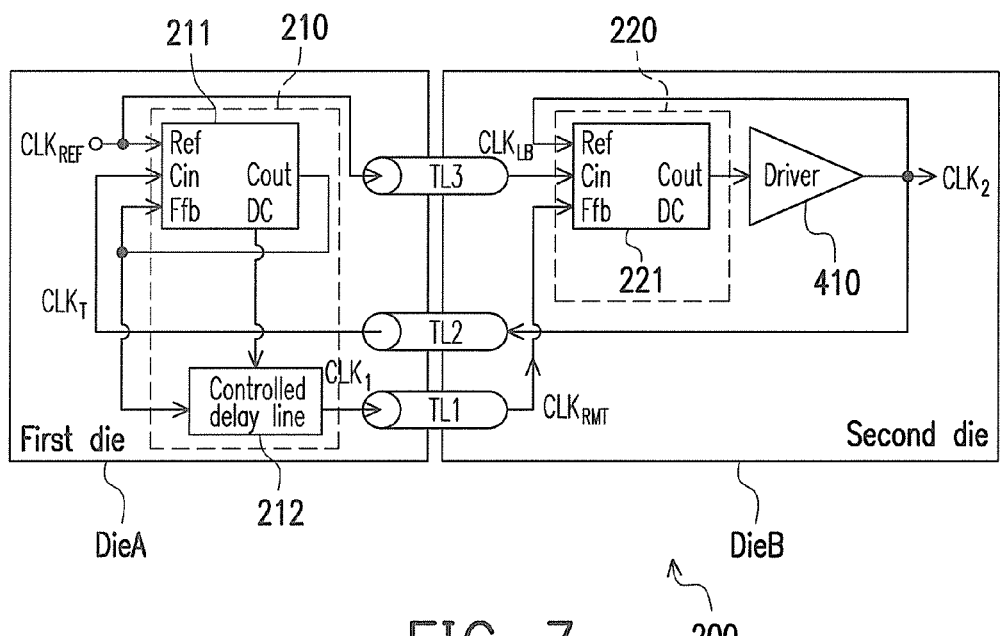
FIG. 7 is a functional block schematic diagram of the apparatus for clock skew compensation of FIG. 2 according to still another exemplary embodiment of the disclosure.

FIG. 7 is a functional block schematic diagram of the apparatus for clock skew compensation 200 of FIG. 2 according to still another exemplary embodiment of the disclosure. In the present exemplary embodiment, the driver 410 receives the clock provided by the output terminal of the second DLL module 220, and the driver 410 provides the clock $CLK_2$ to serve as the operating clock of the second die DieB. Referring to FIG. 7, the first DLL module 210 includes the first DLL 211 and a first CDL 212. The clock reference terminal Ref of the first DLL 211 is electrically connected to the first input terminal of the first DLL module 210 for receiving the reference clock $CLK_{REF}$. The clock output terminal Cout of the first DLL 211 is electrically connected to the clock feedback terminal Ffb of the first DLL 211 and an input terminal of the first CDL 212.

A control terminal of the first CDL 212 is electrically connected to the control terminal of the internal delay line (for example, the VCDL 540 of FIG. 5A or the DCDL 560 of FIG. 5B) of the first DLL 211 through the delay control terminal DC of the first DLL 211. The first CDL 212 applies a corresponding circuit design according to a signal type of the delay control terminal DC of the first DLL 211, for example, a circuit design the same to that of the VCDL 540 or the DCDL 560. Therefore, a delay amount of the first CDL 212 corresponds to a delay amount of the internal delay line of the first DLL 211. In the present exemplary embodiment, the delay amount of the first CDL 212 is the same to the delay amount $t_{VCDL1}$ of the internal delay line of the first DLL 211.

An output terminal of the first CDL 212 is electrically connected to the output terminal of the first DLL module 210 for outputting the clock $CLK_1$ to the transmission channel TL1. The clock input terminal Cin of the first DLL 211 is electrically connected to the second input terminal of the first DLL module 210 for receiving the feedback clock $CLK_T$ transmitted through the transmission channel TL2.

The second DLL module 220 includes the second DLL 221. The clock feedback terminal Ffb of the second DLL 221 is electrically connected to the first input terminal of the second DLL module 220 for receiving the remote clock $CLK_{RMT}$ provided by the transmission channel TL1. The clock input terminal Cin of the second DLL 221 receives the reference clock $CLK_{REF}$ of the first die DieA through the transmission channel TL3 to serve as the feedback clock $CLK_{LB}$. The clock output terminal Cout of the second DLL 221 is electrically connected to the clock reference terminal Ref of the second DLL 221 through the driver 410. The clock output terminal Cout of the second DLL 221 is electrically connected to the output terminal of the second DLL module 220 through the driver 410 for providing the clock $CLK_2$ to the transmission channel TL2.

Figure 8:
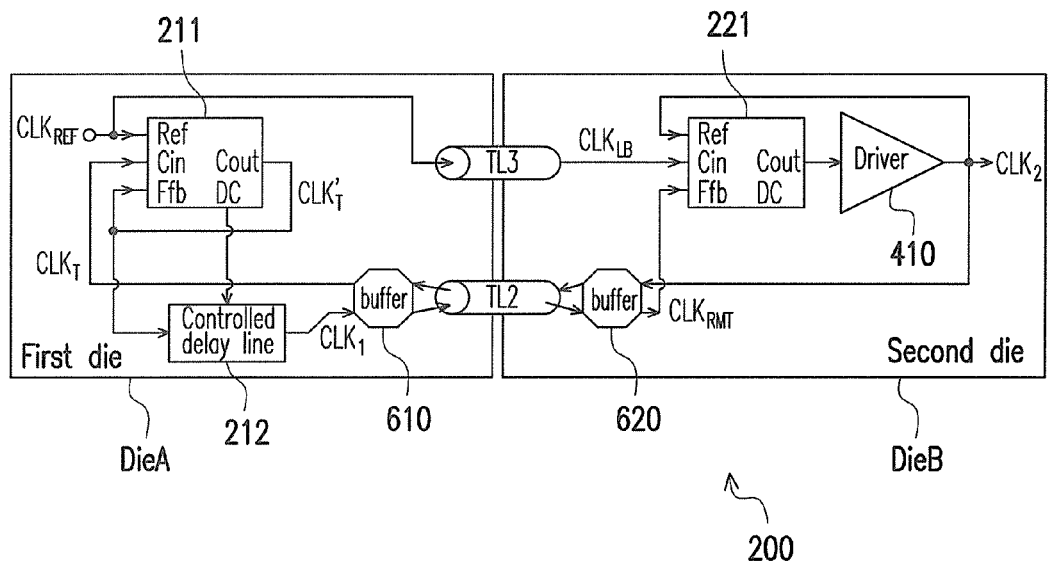
FIG. 8 is a functional block schematic diagram of the apparatus for clock skew compensation of FIG. 2 according to yet another exemplary embodiment of the disclosure.

In other embodiments, the transmission channel TL1 and the transmission channel TL2 can be combined into a single transmission channel. For example, FIG. 8 is a functional block schematic diagram of the apparatus for clock skew compensation 200 of FIG. 2 according to yet another exemplary embodiment of the disclosure. Implementation details of the embodiment of FIG. 8 are the same to that of the embodiment of FIG. 7. Different to the embodiment of FIG. 7, the embodiment of FIG. 8 further includes the bi-directional buffers 610 and 620. Based on operations of the bi-directional buffers 610 and 620, the single transmission channel TL2 can serve as a transmission path for transmitting the clock $CLK_1$ from the first die DieA to the second die DieB, and can serve as a transmission path for transmitting the clock $CLK_2$ from the second die DieB to the first die DieA.

Referring to FIG. 8, it is assumed that a transmission delay amount of the first DLL 211 and the first CDL 212 is $t_{VCDL1}$, a transmission delay amount of the second DLL 221 is $t_{VCDL2}$, a transmission delay amount of the transmission channel TL3 is $t_{TL3}$, a transmission delay amount of the transmission channel TL2 is $t_{TL2}$, and $t_{CD}$ is a clock delay of the driver 410. Regarding a first loop formed by the transmission channel TL3, the second DLL 221, the driver 410, the bi-directional buffer 620, the transmission channel TL2, the bi-directional buffer 610 and the first DLL 211, when the first loop is stable, the transmission delay amount generated by the first loop can be set to twice of the cycle time $T_{CLKREF}$ of the reference clock $CLK_{REF}$, i.e. $2T_{CLKREF}$, and a delay time thereof can be represented by a following equation (5):

$$t_{TL3}+t_{VCDL2}+t_{CD}+t_{TL2}+t_{VCDL1}=2T_{CLKREF} \quad (5)$$

Now, the reference clock $CLK_{REF}$ and the feedback clock $CLK_T'$ of the first DLL 211 are synchronous. Namely, $CLK_T'=CLK_{REF}+N\times T_{CLKREF}$, where N is an integer greater than 1. Regarding a second loop formed by the second DLL 221, the driver 410, the bi-directional buffer 620, the transmission channel TL2, the bi-directional buffer 610, the first DLL 211, the first CDL 212, the bi-directional buffer 610, the transmission channel TL2, the bi-directional buffer 620 and the second DLL 221, when the second loop is stable, the transmission delay amount generated by the second loop can be set to twice of the cycle time $T_{CLKREF}$ of the reference clock $CLK_{REF}$, and a delay time thereof can be represented by a following equation (6):

$$t_{TL2}+t_{VCDL1}+t_{VCDL1}+t_{TL2}=2T_{CLKREF}$$

or $$t_{VCDL1}+t_{TL2}=T_{CLKREF} \quad (6)$$

Now, the clock $CLK_2$ and the remote clock $CLK_{RMT}$ are synchronous. Namely, $CLK_{RMT}=CLK_2+N\times T_{CLKREF}$, where N is an integer greater than 1. By subtracting the equation (6) from the equation (3), a following equation (7) is obtained:

$$t_{TL3}+t_{VCDL2}+t_{CD}=T_{CLKREF} \quad (7)$$

According to the equation (7), it is known that a phase difference of the reference clock $CLK_{REF}$ and the clock $CLK_2$ is 360 degrees (or a time difference there between is one cycle $T_{CLKREF}$ of the reference clock $CLK_{REF}$), i.e. the reference clock $CLK_{REF}$ and the clock $CLK_2$ are synchronous. In the present exemplary embodiment, the clock delay error caused by mismatch of the transmission channels can be eliminated through mutual compensation and balance of the DLL modules 210 and 220, so as to implement the function of clock skew compensation. Moreover, even if one of or both of the transmission channel TL2 and the transmission channel TL3 have a resistive defect, or the transmission channel TL2 and the transmission channel TL3 have a delay error there between, the function of clock phase correction/compensation can still be achieved.

Figure 9:
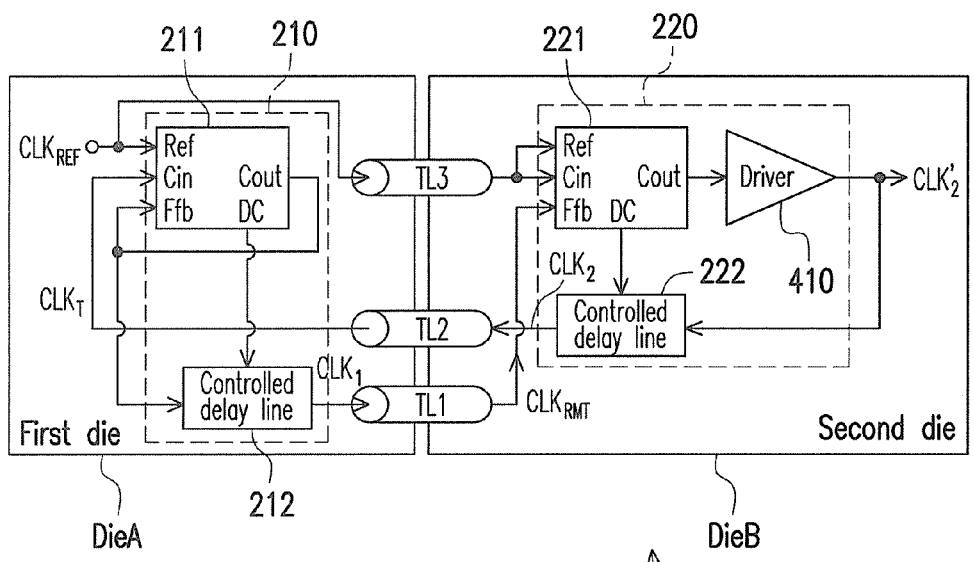
FIG. 9 is a functional block schematic diagram of the apparatus for clock skew compensation of FIG. 2 according to still another exemplary embodiment of the disclosure.

FIG. 9 is a functional block schematic diagram of the apparatus for clock skew compensation 200 of FIG. 2 according to still another exemplary embodiment of the disclosure. The first DLL module 210 includes the first DLL 211 and the first CDL 212. The second DLL module 220 includes the second DLL 221, the second CDL 222 and the driver 410. Referring to FIG. 9, in the present exemplary embodiment, the driver 410 receives an internal clock (i.e. the clock provided by the second DLL 221) of the second DLL module 220, and the driver 410 provides an internal clock $CLK_2'$ to serve as the operating clock of the second die DieB.

The clock reference terminal Ref of the first DLL 211 is electrically connected to the first input terminal of the first DLL module 210 for receiving the reference clock $CLK_{REF}$. The clock output terminal Cout of the first DLL 211 is electrically connected to the clock feedback terminal Ffb of the first DLL 211 and the input terminal of the first CDL 212. The control terminal of the first CDL 212 is electrically connected to the control terminal of the internal delay line (for example, the VCDL 540 of FIG. 5A or the DCDL 560 of FIG. 5B) of the first DLL 211 through the delay control terminal DC of the first DLL 211. The first CDL 212 applies a corresponding circuit design according to a signal type of the delay control terminal DC of the first DLL 211. A delay amount of the first CDL 212 corresponds to a delay amount of the internal delay line of the first DLL 211. In the present exemplary embodiment, the delay amount of the first CDL 212 is the same to the delay amount $t_{VCDL1}$ of the internal delay line of the first DLL 211.

The output terminal of the first CDL 212 is electrically connected to the output terminal of the first DLL module 210 for outputting the clock $CLK_1$ to the transmission channel TL1. The clock input terminal Cin of the first DLL 211 is electrically connected to the second input terminal of the first DLL module 210 for receiving the feedback clock $CLK_T$ transmitted through the transmission channel TL2.

The clock feedback terminal Ffb of the second DLL 221 is electrically connected to the first input terminal of the second DLL module 220 for receiving the remote clock $CLK_{RMT}$ provided by the transmission channel TL1. The clock input terminal Cin and the clock reference terminal Ref of the second DLL 221 receives the reference clock $CLK_{REF}$ of the first die DieA through the transmission channel TL3 to serve as the feedback clock $CLK_{LB}$. The clock output terminal Cout of the second DLL 221 is electrically connected to the input terminal of the second CDL 222 through the driver 410, and provides the internal clock $CLK_2'$ through the driver 410 to serve as the operating clock of the second die DieB.

The output terminal of the second CDL 222 is electrically connected to the output terminal of the second DLL module 220 for providing the clock signal $CLK_2$ to the transmission channel TL2. The control terminal of the second CDL 222 is electrically connected to the control terminal of the internal delay line (for example, the VCDL 540 of FIG. 5A or the DCDL 560 of FIG. 5B) of the second DDL 221 through the delay control terminal DC of the second DLL 221. The second CDL 222 applies a corresponding circuit design according to a signal type of the delay control terminal DC of the second DLL 221. A delay amount of the second CDL 222 corresponds to a delay amount of the internal delay line of the second DLL 221. In the present exemplary embodiment, the delay amount of the second CDL 222 is the same to the delay amount $t_{VCDL1}$ of the internal delay line of the second DLL 221.

Figure 10:
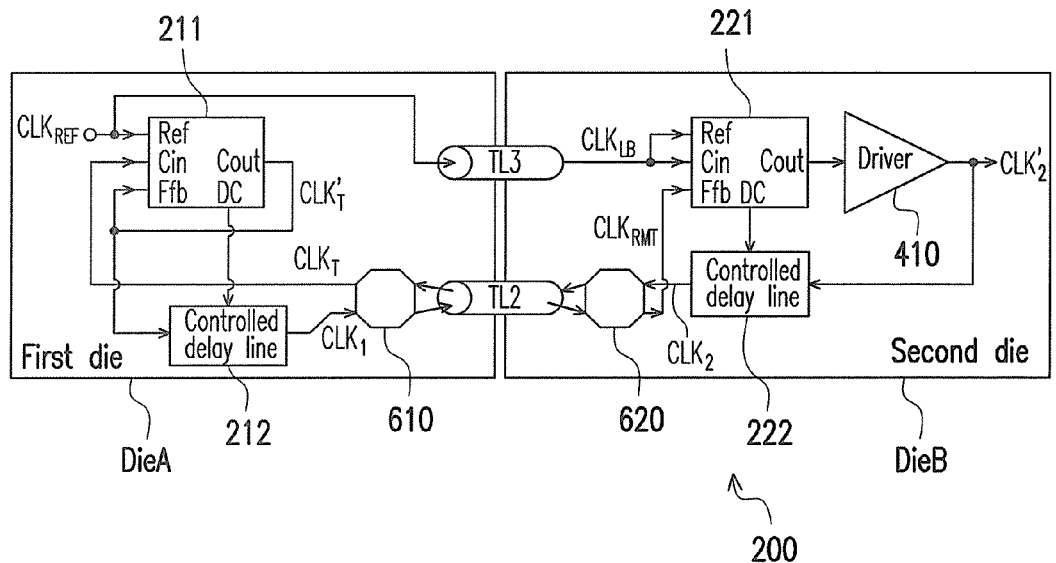
FIG. 10 is a functional block schematic diagram of the apparatus for clock skew compensation of FIG. 2 according to still another exemplary embodiment of the disclosure.

In other embodiments, the transmission channel TL1 and the transmission channel TL2 can be combined into a single transmission channel. For example, FIG. 10 is a functional block schematic diagram of the apparatus for clock skew compensation 200 of FIG. 2 according to still another exemplary embodiment of the disclosure. Implementation details of the embodiment of FIG. 10 are the same to that of the embodiment of FIG. 9. Different to the embodiment of FIG. 9, the embodiment of FIG. 10 further includes the bi-directional buffers 610 and 620. Based on operations of the bi-directional buffers 610 and 620, the single transmission channel TL2 can serve as a transmission path for transmitting the clock $CLK_1$ from the first die DieA to the second die DieB, and can serve as a transmission path for transmitting the clock $CLK_2$ from the second die DieB to the first die DieA.

Referring to FIG. 10, it is assumed that a transmission delay amount of the first DLL 211 and the first CDL 212 is $t_{VCDL1}$, a transmission delay amount of the second DLL 221 and the second CDL 222 is $t_{VCDL2}$, a transmission delay amount of the transmission channel TL3 is $t_{TL3}$, a transmission delay amount of the transmission channel TL2 is $t_{TL2}$, and $t_{CD}$ is a clock delay of the driver 410. Regarding a first loop formed by the transmission channel TL3, the second DLL 221, the driver 410, the second CDL 222, the bi-directional buffer 620, the transmission channel TL2, the bi-directional buffer 610 and the first DLL 211, when the first loop is stable, the transmission delay amount generated by the first loop can be set to triple of the cycle time $T_{CLKREF}$ of the reference clock $CLK_{REF}$, i.e. $3T_{CLKREF}$, and a delay time thereof can be represented by a following equation (8):

$$t_{TL3}+t_{VCDL2}+t_{CD}+t_{VCDL2}+t_{TL2}+t_{VCDL1}=3T_{CLKREF} \qquad (8)$$

Now, the reference clock $CLK_{REF}$ and the feedback clock $CLK_T'$ of the first DLL 211 are synchronous. Namely, $CLK_T'=CLK_{REF}+N\times T_{CLKREF}$, where N is an integer greater than 1. Regarding a second loop formed by the second DLL 221, the driver 410, the second CDL 222, the bi-directional buffer 620, the transmission channel TL2, the bi-directional buffer 610, the first DLL 211, the first CDL 212, the bi-directional buffer 610, the transmission channel TL2, the bi-directional buffer 620 and the second DLL 221, when the second loop is stable, the transmission delay amount generated by the second loop can be set to quadruple of the cycle time $T_{CLKREF}$ of the reference clock $CLK_{REF}$, and a delay time thereof can be represented by a following equation (9):

$$t_{VCDL2}+t_{VCDL2}+t_{TL2}+t_{VCDL1}+t_{VCDL1}+t_{TL2}=4T_{CLKREF}$$

or $$t_{VCDL2}+t_{TL2}+t_{VCDL1}=2T_{CLKREF} \qquad (9)$$

By subtracting the equation (9) from the equation (8), a following equation (10) is obtained:

$$t_{TL3}+t_{VCDL2}+t_{CD}=T_{CLKREF} \qquad (10)$$

According to the equation (10), it is known that a phase difference of the reference clock $CLK_{REF}$ and the clock $CLK_2'$ is 360 degrees (or a time difference there between is one cycle $T_{CLKREF}$ of the reference clock $CLK_{REF}$), i.e. the reference clock $CLK_{REF}$ and the clock $CLK_2'$ are synchronous.

The apparatus for clock skew compensation 200 applies a latch-based dual DLL (LBD-DLL) technique, which can correct/compensate skew of the clocks of the system without assistance of a delay measurement (DM) circuit or a dummy channel. Moreover, in a three-dimensional integrated circuit (3D-IC) system, if delay defects of the through silicon vias (TSVs) used for connecting the bare dies are greatly increased due to PVTL variations or resistive defects, according to the above embodiments, the CDLs can be used to compensate the clock skew amount, so as to ensure synchronization of the clocks of different layers. In the above embodiments, a driving circuit or a predetermined delay amount can be inducted to the correcting loop in advance, for example, the clock delay $t_{CD}$ mentioned in the embodiments of FIG. 6, FIG. 8 and FIG. 10. In this way, an error amount of the driver 410 in the clock tree can be regarded as a part of the transmission delay, so that the apparatus for clock skew compensation 200 can compensate or correct the error amount of the driver 410.

Figure 11:
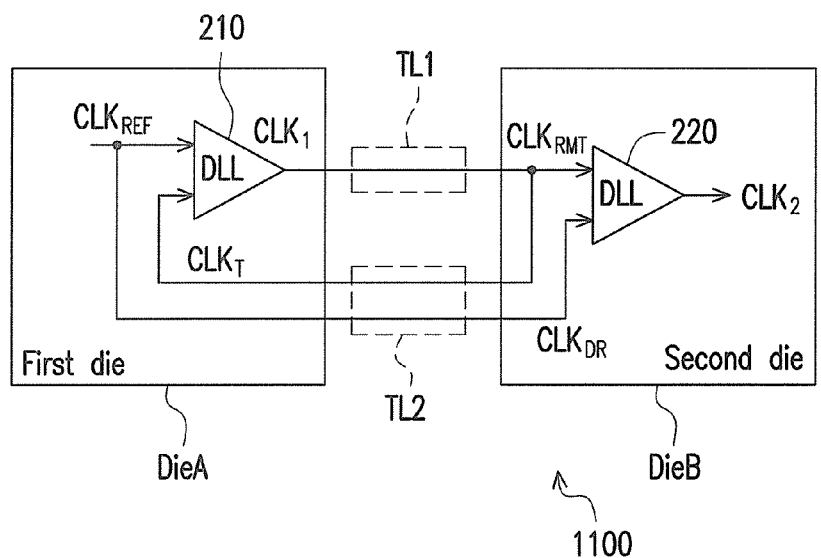
FIG. 11 is a circuit schematic diagram of an apparatus for clock skew compensation according to another exemplary embodiment of the disclosure.

FIG. 11 is a circuit schematic diagram of an apparatus for clock skew compensation 1100 according to another exemplary embodiment of the disclosure. The apparatus for clock skew compensation 1100 includes a first DLL module 210 and a second DLL module 220. The first DLL module is disposed in the first die DieA, and the second DLL module 220 is disposed in the second die DieB. A first input terminal of the first DLL module 210 receives the reference clock $CLK_{REF}$ (for example, the operating clock of the first die DieA).

A first input terminal of the second DLL module 220 is electrically connected to an output terminal and a second input terminal of the first DLL module 210 through different transmission channels. For example, the first input terminal of the second DLL module 220 is electrically connected to the output terminal of the first DLL module 210 through the transmission channel TL1, and the first input terminal of the second DLL module 220 is electrically connected to the second input terminal of the first DLL module 210 through the transmission channel TL2. A second input terminal of the second DLL module 220 receives the reference clock $CLK_{REF}$ of the first die DieA through the transmission channel TL2. A clock of an output terminal of the second DLL module 220 serves as an operating clock of the second die DieB.

The operation of the apparatus for clock skew compensation 1100 is divided into two stages of an initial stage and a normal operation stage. The normal operation stage is a normal operation period of the second die DieB. During an abnormal operation period of the second die DieB, for example, a booting period, a reset period and/or other periods, the apparatus for clock skew compensation 1100 is in the initial stage. Here, it is assumed that a transmission delay amount of the first DLL module 210 is $t_{DCDL1}$, a transmission delay amount of the second DLL module 220 is $t_{DCDL2}$, a transmission delay amount of the transmission channel TL1 is $t_{TL1}$, and a transmission delay amount of the transmission channel TL2 is $t_{TL2}$.

During the initial stage, the first DLL module 210 compares the phases of the reference clock $CLK_{REF}$ and the feedback clock $CLK_T$, and determines the delay time $t_{DCDL1}$ of the reference clock $CLK_{REF}$ according to a comparison result, so as to obtain a clock $CLK_1$. The clock CLK1 is changed to a clock $CLK_{RMT}$ through the transmission delay of the transmission channel TL1. The clock $CLK_{RMT}$ is changed to a feedback clock $CLK_T$ through the transmission delay of the transmission channel TL2. After the loop is stable, the transmission delay amount of this loop is set to an integral multiple of the cycle time $T_{CLKREF}$ of the reference clock $CLK_{REF}$. Now, the first DLL module 210 records its transmission delay amount $t_{DCDL1}$, and fixes the transmission delay amount $t_{DCDL1}$ to end the initial stage. After the initial stage is ended, the first DLL module 210 does not compare the phases of the reference clock $CLK_{REF}$ and the feedback clock $CLK_T$. During the normal operation stage, the first DLL module 210 only fixedly delays the reference clock $CLK_{REF}$ by the transmission delay amount $t_{DCDL1}$ recorded during the initial stage, so as to output the clock $CLK_1$.

During the normal operation stage, the reference clock $CLK_{REF}$ is changed to a clock $CLK_{DR}$ through the transmission delay of the transmission channel TL2. During the normal operation stage, the second DLL module 220 determines the delay time $t_{DCDL2}$ of the clock $CLK_{RMT}$ according to a phase of the clock $CLK_{DR}$, so as to obtain a clock $CLK_2$.

Figure 12:
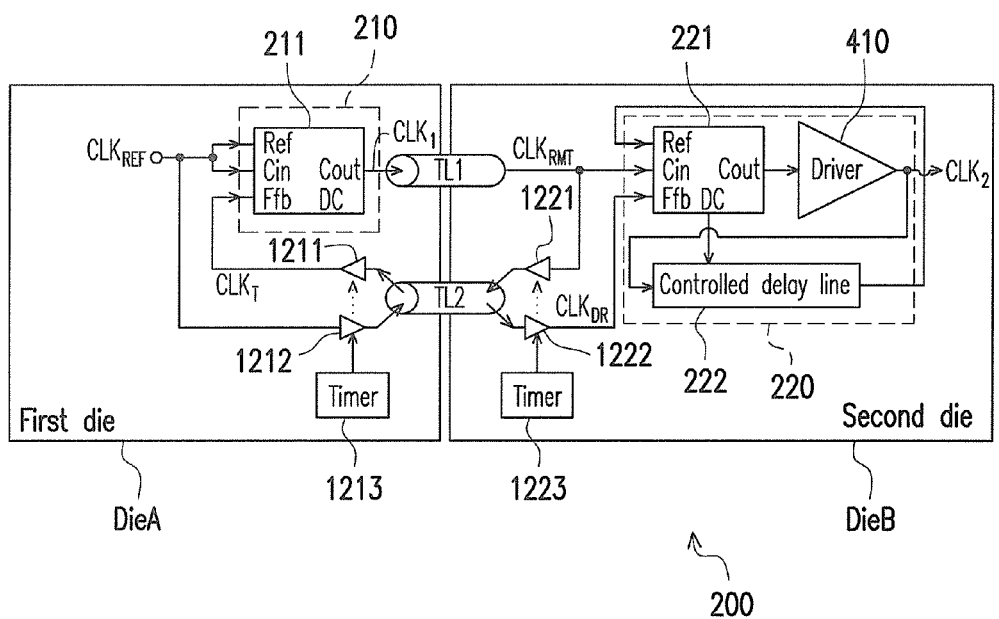
FIG. 12 is a functional block schematic diagram of the apparatus for clock skew compensation of FIG. 11 according to another exemplary embodiment of the disclosure.

FIG. 12 is a functional block schematic diagram of the apparatus for clock skew compensation 1100 of FIG. 11 according to another exemplary embodiment of the disclosure. The first DLL module 210 includes the first DLL 211. The second DLL module 220 includes the second DLL 211 and the second CDL 222. In the present exemplary embodiment, implementations of the first and the second DLLs 211 and 221 can be as that shown in FIG. 5B. The clock reference terminal Ref and the clock input terminal Cin of the first DLL 211 are electrically connected to the first input terminal of the first DLL module 210 for receiving the reference clock $CLK_{REF}$. The clock feedback terminal Ffb of the first DLL 211 is electrically connected to the second input terminal of the first DLL module 210 for connecting the transmission channel TL2 through a tri-state buffer 1211. The clock output terminal Cout of the first DLL 211 is electrically connected to the output terminal of the first DLL module 210 for connecting the transmission channel TL1.

The clock input terminal Cin of the second DLL 221 is electrically connected to the first input terminal of the second DLL module 220 for connecting the transmission channel TL1. The clock input terminal Cin of the second DLL 221 is further electrically connected to the transmission channel TL2 through a tri-state buffer 1221. The clock feedback terminal Ffb of the second DLL 221 is electrically connected to the second input terminal of the second DLL module 220 for connecting the transmission channel TL2 through a tri-state buffer 1222. The clock output terminal Cout of the second DLL 221 is electrically connected to the output terminal of the second DLL module 220 and the input terminal of the second CDL 222 through the driver 410. The output terminal of the second CDL 222 is electrically connected to the clock reference terminal Ref of the second DLL 221.

The control terminal of the second CDL 222 is electrically connected to the control terminal of the internal delay line (for example, the DCDL 560 of FIG. 5B) of the second DLL 221 through the delay control terminal DC of the second DLL 221. Therefore, a delay amount of the second CDL 222 corresponds to a delay amount of the internal delay line of the second DLL 221. In the present exemplary embodiment, the delay amount of the second CDL 222 is the same to the delay amount $t_{DCDL2}$ of the internal delay line of the second DLL 221.

Timers 1213 and 1223 respectively control conducting states of the tri-state buffers 1211, 1212, 1221 and 1222. During the initial stage of the apparatus for clock skew compensation 1100, the timers 1213 and 1223 respectively control the tri-state buffers 1211 and 1221 to be in a turned-on state, and controls the tri-state buffers 1212 and 1222 to be in a turned-off state. Therefore, during the initial state, the first DLL 211 compares the phases of the reference clock $CLK_{REF}$ and the feedback clock $CLK_T$, and determines the delay time $t_{DCDL1}$ of the reference clock $CLK_{REF}$ according to a comparison result, so as to obtain a clock $CLK_1$. The clock CLK1 is changed to a clock $CLK_{RMT}$ through the transmission delay of the transmission channel TL1. The clock $CLK_{RMT}$ is changed to a feedback clock $CLK_T$ through the transmission delay of the transmission channel TL2. After the loop is stable, the transmission delay amount of this loop is set to an integral multiple of the cycle time $T_{CLKREF}$ of the reference clock $CLK_{REF}$. Now, the first DLL module 210 records its transmission delay amount $t_{DCDL1}$, and ends the initial stage. After the initial stage is ended, the first DLL 211 does not compare the phases of the reference clock $CLK_{REF}$ and the feedback clock $CLK_T$. During the normal operation stage, the first DLL module 210 only fixedly delays the reference clock $CLK_{REF}$ by the transmission delay amount $t_{DCDL1}$ recorded during the initial stage, so as to output the clock $CLK_1$. The delay time of such loop is shown in a following equation (11):

$$t_{DCDL1}+t_{TL1}+t_{TL2}=T_{CLKREF} \quad (11)$$

During the normal operation stage, the timers 1213 and 1223 respectively control the tri-state buffers 1211 and 1221 to be in the turned-off state, and controls the tri-state buffers 1212 and 1222 to be in the turned-on state. The reference clock $CLK_{REF}$ is changed to the clock $CLK_{DR}$ through the transmission delay of the transmission channel TL2. During the normal operation stage, the second DLL 221 compares the phases of the clock $CLK_{DR}$ and a clock output by the second CDL 222, and determines the delay time $t_{DCDL2}$ of the clock $CLK_{RMT}$ according to a comparison result, so as to obtain the clock $CLK_2$. After the loop is stable, the transmission delay amount of this loop is set to an odd multiple of the cycle time $T_{CLKREF}$ of the reference clock $CLK_{REF}$. For example, a delay time of such loop is represented by a following equation (12):

$$t_{DCDL1}+t_{TL1}+2t_{DCDL2}-t_{TL2}=3T_{CLKREF} \quad (12)$$

By adding the equation (11) and the equation (12), an equation (13) is obtained:

$$2t_{DCDL1}+2t_{TL1}+2t_{DCDL2}=4T_{CLKREF}$$

or $$t_{DCDL1}+t_{TL1}+t_{DCDL2}=2T_{CLKREF} \quad (13)$$

According to the equation (13), it is known that a phase difference of the reference clock $CLK_{REF}$ and the clock $CLK_2$ is 720 degrees (or a time difference there between is two cycles $T_{CLKREF}$ of the reference clock $CLK_{REF}$), i.e. the reference clock $CLK_{REF}$ and the clock $CLK_2$ are synchronous.

In summary, the aforementioned embodiments can be widely applied for clock synchronization of system on chip (SoC) or 3D-IC systems. In case of an unexpected transmission delay, the clock signals between the bare dies can be corrected and synchronized, and the apparatus of the disclosure has a wide correction range and a low clock phase error, which can provide a heterogeneous integration application of the 3D-IC.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An apparatus for clock skew compensation, comprising:
a first delay locked loop (DLL) module, disposed in a first die, and having a first input terminal receiving a reference clock; and
a second DLL module, disposed in a second die, having a first input terminal electrically connected to an output terminal of the first DLL module, and an output terminal electrically connected to a second input terminal of the first DLL module.

2. The apparatus for clock skew compensation as claimed in claim 1, wherein the reference clock serves as an operating clock of the first die, and a clock of the output terminal of the second DLL module serves as an operating clock of the second die.

3. The apparatus for clock skew compensation as claimed in claim 1, wherein the first DLL module comprises a first DLL and a first controlled delay line, the second DLL module comprises a second DLL, a clock reference terminal of the first DLL is electrically connected to the first input terminal of the first DLL module for receiving the reference clock, a clock output terminal of the first DLL is electrically connected to a clock feedback terminal of the first DLL and an input terminal of the first controlled delay line, a control terminal of the first controlled delay line is electrically connected to a control terminal of an internal delay line of the first DLL, an output terminal of the first controlled delay line is electrically connected to the output terminal of the first DLL module, a clock input terminal of the first DLL is electrically connected to the second input terminal of the first DLL module, a clock feedback terminal of the second DLL is electrically connected to the first input terminal of the second DLL module, a clock input terminal of the second DLL receives the reference clock through the first die, and a clock output terminal of the second DLL is electrically connected to a clock reference terminal of the second DLL and the output terminal of the second DLL module.

4. The apparatus for clock skew compensation as claimed in claim 1, wherein the reference clock serves as an operating clock of the first die, and an internal clock of the second DLL module serves as an operating clock of the second die.

5. The apparatus for clock skew compensation as claimed in claim 1, wherein the first DLL module comprises a first DLL and a first controlled delay line, the second DLL module comprises a second DLL and a second controlled delay line, a clock reference terminal of the first DLL is electrically connected to the first input terminal of the first DLL module for receiving the reference clock, a clock output terminal of the first DLL is electrically connected to a clock feedback terminal of the first DLL and an input terminal of the first controlled delay line, a control terminal of the first controlled delay line is electrically connected to a control terminal of an internal delay line of the first DLL, an output terminal of the first controlled delay line is electrically connected to the output terminal of the first DLL module, a clock input terminal of the first DLL is electrically connected to the second input terminal of the first DLL module, a clock feedback terminal of the second DLL is electrically connected to the first input terminal of the second DLL module, a clock input terminal and a clock reference terminal of the second DLL receive the reference clock through the first die, a clock output terminal of the second DLL is electrically connected to an input terminal of the second controlled delay line, a control terminal of the second controlled delay line is electrically connected to a control terminal of an internal delay line of the second DLL, and an output terminal of the second controlled delay line is electrically connected to the output terminal of the second DLL module.

6. The apparatus for clock skew compensation as claimed in claim 1, wherein the reference clock serves as an operating clock of the first die, and a clock of the first input terminal of the second DLL module serves as an operating clock of the second die.

7. The apparatus for clock skew compensation as claimed in claim 1, wherein the first DLL module comprises a first DLL, the second DLL module comprises a second DLL and a second controlled delay line, a clock reference terminal and a clock input terminal of the first DLL are electrically connected to the first input terminal of the first DLL module for receiving the reference clock, a clock feedback terminal of the first DLL is electrically connected to the second input terminal of the first DLL module, a clock output terminal of the first DLL is electrically connected to the output terminal of the first DLL module, a clock reference terminal and a clock input terminal of the second DLL are electrically connected to the first input terminal of the second DLL module, a clock output terminal of the second DLL is electrically connected to the output terminal of the second DLL module, an input terminal of the second controlled delay line is electrically connected to the clock feedback terminal of the first DLL, a control terminal of the second controlled delay line is electrically connected to a control terminal of an internal delay line of the second DLL, and an output terminal of the second controlled delay line is electrically connected to a clock feedback terminal of the second DLL.

8. An apparatus for clock skew compensation, comprising:
a first delay locked loop (DLL) module, disposed in a first die, and having a first input terminal receiving a reference clock; and
a second DLL module, disposed in a second die, having a first input terminal electrically connected to an output terminal and a second input terminal of the first DLL module through different transmission channels, and a second input terminal receiving the reference clock through the first die, wherein a clock of an output terminal of the second DLL module serves as an operating clock of the second die.

9. The apparatus for clock skew compensation as claimed in claim 8, wherein the first DLL module comprises a first DLL, the second DLL module comprises a second DLL and a second controlled delay line, a clock reference terminal and a clock input terminal of the first DLL are electrically connected to the first input terminal of the first DLL module for receiving the reference clock, a clock feedback terminal of the first DLL is electrically connected to the second input terminal of the first DLL module, a clock output terminal of the first DLL is electrically connected to the output terminal of the first DLL module, a clock input terminal of the second DLL is electrically connected to the first input terminal of the second DLL module, a clock feedback terminal of the second DLL is electrically connected to the second input terminal of the second DLL module, a clock output terminal of the second DLL is electrically connected to the output terminal of the second DLL module and an input terminal of the second controlled delay line, a control terminal of the second controlled delay line is electrically connected to a control terminal of an internal delay line of the second DLL, and an output terminal of the second controlled delay line is electrically connected to a clock reference terminal of the second DLL.

10. The apparatus for clock skew compensation as claimed in claim 8, wherein the reference clock serves as an operating clock of the first die.

* * * * *